(12) United States Patent
Paludan-Müller et al.

(10) Patent No.: US 11,996,812 B2
(45) Date of Patent: May 28, 2024

(54) METHOD OF OPERATING AN EAR LEVEL AUDIO SYSTEM AND AN EAR LEVEL AUDIO SYSTEM

(71) Applicant: WIDEX A/S, Lynge (DK)

(72) Inventors: Carsten Paludan-Müller, Frederikssund (DK); Alan Wiinberg, Fredensborg (DK)

(73) Assignee: WIDEX A/S, Lynge (DK)

( * ) Notice: Subject to any disclaimer, the term of this patent is extended or adjusted under 35 U.S.C. 154(b) by 142 days.

(21) Appl. No.: 17/763,457

(22) PCT Filed: Sep. 23, 2020

(86) PCT No.: PCT/EP2020/076471
§ 371 (c)(1),
(2) Date: Mar. 24, 2022

(87) PCT Pub. No.: WO2021/058506
PCT Pub. Date: Apr. 1, 2021

(65) Prior Publication Data
US 2022/0345101 A1     Oct. 27, 2022

(30) Foreign Application Priority Data

Sep. 27, 2019   (DK) ............................... PA201901115

(51) Int. Cl.
*H03G 3/32*          (2006.01)
*H03G 9/00*          (2006.01)
(Continued)

(52) U.S. Cl.
CPC ............... *H03G 3/32* (2013.01); *H03G 9/005* (2013.01); *H03G 9/025* (2013.01);
(Continued)

(58) Field of Classification Search
CPC . H04R 1/1083; H04R 25/505; H04R 2225/43
See application file for complete search history.

(56) References Cited

U.S. PATENT DOCUMENTS 6,240,192 B1 *   5/2001   Brennan ............... H04R 25/505
                                                    381/314
9,264,822 B2 *   2/2016   Zhang .................. H04R 25/405
(Continued)

FOREIGN PATENT DOCUMENTS

EP     0 326 905 A1    8/1989
EP     2 375 781 A1    10/2011
(Continued)

OTHER PUBLICATIONS

Search Report and Search Opinion of Danish Application No. PA 2019 01115 dated Mar. 6, 2020.
(Continued)

*Primary Examiner* — Suhan Ni
(74) *Attorney, Agent, or Firm* — Sughrue Mion, PLLC

(57) ABSTRACT

A method (400) of operating an ear level audio system, comprises the steps of applying (401) a first frequency dependent gain to an input signal in order to provide a first processed input signal adapted to at least one of compensating a hearing loss and suppressing noise, determining (402) a noise floor level of the first processed input signal, applying (403) a second frequency dependent gain to the first processed input signal and hereby providing an output signal such that for at least one frequency range the noise floor level of the output signal is positioned at a selected position above or below a hearing threshold.

8 Claims, 2 Drawing Sheets

(51) Int. Cl.
*H03G 9/02* (2006.01)
*H04R 1/10* (2006.01)
*H04R 25/00* (2006.01)

(52) U.S. Cl.
CPC ......... *H04R 1/1083* (2013.01); *H04R 25/505* (2013.01); *H04R 2225/43* (2013.01)

(56) References Cited

U.S. PATENT DOCUMENTS

| | | |
|---|---|---|
| 2004/0190740 A1 | 9/2004 | Chalupper et al. |
| 2005/0111683 A1 | 5/2005 | Chabries et al. |
| 2013/0136282 A1 | 5/2013 | McClain |
| 2013/0195278 A1* | 8/2013 | Swanson ................. H03G 1/00 381/57 |
| 2015/0172807 A1* | 6/2015 | Olsson ................ G10L 21/0208 381/74 |
| 2019/0373359 A1* | 12/2019 | Luo ........................ H03G 9/025 |
| 2022/0303694 A1* | 9/2022 | Sun ..................... H04R 25/505 |

FOREIGN PATENT DOCUMENTS

| | | |
|---|---|---|
| EP | 2 981 100 A1 | 2/2016 |
| JP | 10-200996 A | 7/1998 |
| WO | 96/13096 A1 | 5/1996 |
| WO | 01/69504 A2 | 9/2001 |
| WO | 02/084866 A1 | 10/2002 |
| WO | 2018/130287 A1 | 7/2018 |

OTHER PUBLICATIONS

International Search Report of PCT/EP2020/076471 dated Jan. 20, 2021 [PCT/ISA/210].
Written Opinion of PCT/EP2020/076471 dated Jan. 20, 2021 [PCT/ISA/237].

* cited by examiner

METHOD OF OPERATING AN EAR LEVEL AUDIO SYSTEM AND AN EAR LEVEL AUDIO SYSTEM

CROSS REFERENCE TO RELATED APPLICATIONS

This application is a National Stage of International Application No. PCT/EP2020/076471, filed Sep. 23, 2020, claiming priority to Danish Patent Application No. PA201901115, filed Sep. 27, 2019.

The present invention relates to a method of operating an ear level audio system. It also relates to an ear level audio system adapted to carry out said method.

BACKGROUND OF THE INVENTION

An ear level audio system may comprise one or two ear level audio devices. In this application, an ear level audio device should be understood as a small, battery-powered, microelectronic device designed to be worn in or at an ear of a user. The ear level audio device generally comprises an energy source such as a battery or a fuel cell, at least one microphone, a microelectronic circuit comprising a digital signal processor, and an acoustic output transducer. The ear level audio device is enclosed in a casing suitable for fitting in or at (such as behind) a human ear.

According to variations the mechanical design of an ear level audio device may resemble those of hearing aids and as such traditional hearing aid terminology may be used to describe various mechanical implementations of ear level audio devices that are not hearing aids. As the name suggests, Behind-The-Ear (BTE) hearing aids are worn behind the ear. To be more precise, an electronics unit comprising a housing containing the major electronics parts thereof is worn behind the ear. An earpiece for emitting sound to the hearing aid user is worn in the ear, e.g. in the concha or the ear canal. In a traditional BTE hearing aid, a sound tube is used to convey sound from the output transducer, which in hearing aid terminology is normally referred to as the receiver, located in the housing of the electronics unit and to the ear canal. In more recent types of hearing aids, a conducting member comprising electrical conductors conveys an electric signal from the housing and to a receiver placed in the earpiece in the ear. Such hearing aids are commonly referred to as Receiver-In-The-Ear (RITE) hearing aids. In a specific type of RITE hearing aids the receiver is placed inside the ear canal. This category is sometimes referred to as Receiver-In-Canal (RIC) hearing aids. In-The-Ear (ITE) hearing aids are designed for arrangement in the ear, normally in the funnel-shaped outer part of the ear canal. In a specific type of ITE hearing aids the hearing aid is placed substantially inside the ear canal. This category is sometimes referred to as Completely-In-Canal (CIC) hearing aids or Invisible-In-Canal (IIC). This type of hearing aid requires an especially compact design in order to allow it to be arranged in the ear canal, while accommodating the components necessary for operation of the hearing aid.

In fact a hearing aid system is one example of an ear level audio system. Generally, a hearing aid system according to the invention is understood as meaning any device which provides an output signal that can be perceived as an acoustic signal by a user or contributes to providing such an output signal, and which has means which are customized to compensate for an individual hearing loss of the user or contribute to compensating for the hearing loss of the user. They are, in particular, hearing aids which can be worn on the body or by the ear, in particular on or in the ear, and which can be fully or partially implanted. However, some devices whose main aim is not to compensate for a hearing loss, may also be regarded as hearing aid systems, for example consumer electronic devices (such as headsets) provided they have, measures for compensating for an individual hearing loss.

Within the present context an ear level audio system may comprise a single ear level audio device (a so called monaural system) or comprise two ear level audio devices, one for each ear of the user (a so called binaural system). Furthermore, the ear level audio system may comprise an external device, such as a smart phone having software applications adapted to interact with other devices of the ear level audio system. Thus within the present context the term "ear level audio system device" may denote an ear level audio device such as a hearing aid or an external device, such as a smart phone.

As more features, such as advanced noise reduction algorithms, are implemented in ear level audio systems, it becomes more difficult to control where the output level is placed, relative to a user's hearing threshold (in the following this may also be denoted a hearing loss, while keeping in mind that the hearing loss may be zero i.e. that the user has normal hearing). One example of a contemporary advanced noise reduction algorithm is the Speech Intelligibility Index (SII) based noise reduction that seeks to select the optimum gain based on the frequency dependent hearing threshold of a specific user and based on a model of speech intelligibility for a given frequency dependent signal to noise ratio. However, the gain hereby selected may not be an optimum selection for all users.

WO 2001/069504 discloses a hearing aid system wherein an additional personalized gain is applied on top of and independent of the various other gains (including e.g. adaptive gains from noise reduction algorithms) applied as part of the signal processing. However, this additional personalized gain is directed at adjustments of the prescribed gain curve and as such does not provide control of the actual hearing aid output level in any given sound environment because this also depends on the various other applied gains.

It is therefore an object of the present invention to provide a method of operating an ear level audio system whereby improved perceived sound quality is obtained for the user.

SUMMARY OF THE INVENTION

The invention, in a first aspect, provides a method of operating an ear level audio system, comprising the steps of:
  applying a first frequency dependent gain to an input signal in order to provide a first processed input signal that is adapted to at least one of compensating a hearing loss and suppressing noise;
  determining a noise floor level of the first processed input signal; and
  applying a second frequency dependent gain to the first processed input signal and hereby providing an output signal such that for at least one frequency range the noise floor level of the output signal is positioned at a selected position above or below a hearing threshold.

With the method according to the present invention, it is therefore possible to control the placement of the noise floor, relative to the user's hearing threshold, thereby achieving a satisfactory overall output level from the ear level audio system.

In the present context the general term "noise floor" may be used to represent the noise floor level of a processed signal that has had a gain applied. Thus, the term may be used independent on whether the gain has been applied in order to compensate a hearing loss, to suppress noise or whether an additional gain has been applied in order to alter the level of the noise floor. In the following a distinction may be made with respect to whether the noise floor is related to the first processed input signal or related to the output signal, and therefore the terms "processed input signal noise floor level" and "noise floor level of the processed input signal" may be used for the former case, and the terms "output signal noise floor level" and "noise floor level of the output signal" or simply "output signal noise floor" may be used in the latter case. However, in case the general term "noise floor" is applied it will follow from the context whether it is related to a processed input signal or to the output signal.

Furthermore it is noted that the general term "noise floor" may be used interchangeably with the term "aided noise floor" that is a term commonly used within the field of hearing aid systems to also represent the noise floor of a processed signal that has had a gain applied.

It is further noted that in the present context the general term "hearing threshold" in the following may also be used interchangeably with a "hearing loss", while keeping in mind that the hearing loss may be zero i.e. that a user has normal hearing.

It is a general insight of the inventors of the present application that the relative positioning of the output signal noise floor relative to the hearing threshold is important with respect to the perceived sound quality from an ear level audio system.

It is a further insight of the inventors that the relative positioning of the noise floor and the individual hearing threshold is a key element for controlling the overall output level of a hearing aid system in the best possible way. The relative position of the noise floor and the individual hearing threshold is used when applying the second frequency-dependent dependent gain, after applying the first frequency-dependent gain in order to provide at least one of compensating a hearing loss and suppressing noise.

According to an embodiment, applying the second frequency dependent gain depends on a noise level, wherein the second frequency dependent gain is faded out outside a particular range of said noise level.

Positioning of the output signal noise floor level with respect to the hearing threshold may therefore only be active in louder and therefore more noisy ambient sound environments, for example.

It is further preferred that the second frequency dependent gain is applied individually in a multitude of frequency bands. Consequently, in some frequency bands the user has full audibility of the whole dynamic range of the signal, and in other bands the user has audibility only in the louder parts of the signal.

According to an embodiment, in case of a mild hearing loss in the range of say below 50 dB HL (dB hearing loss) or in the range between say 25 to 40 dB HL, the selected position of the output signal noise floor level will generally be above the hearing loss threshold. According to variations the noise floor of the output signal level may be positioned between 10 and 50 dB above the hearing threshold or between 10 and 30 above. This positioning of the noise floor of the output signal minimizes the comb filter effect by avoiding that the total hearing aid gain and the gain of the directly transmitted sound are too close.

According to another embodiment, in case of a moderate hearing loss in the range between say 40 dB HL to 55 dB HL, the output signal noise floor will generally be positioned between (+)10 dB above and (−)10 dB below the hearing threshold or between (+)5 and (−)5 dB above and below the hearing threshold respectively. Tests have indicated that people with a moderate hearing loss generally prefer the output signal noise floor to be placed around the hearing threshold. This does not have a detrimental effect on speech intelligibility, despite that this was to be expected based on e.g. the Speech Intelligibility Index (SII) that forms the basis of SII based noise reduction methods.

According to yet another embodiment, in case of a severe or profound hearing loss in the range above say 55 dB HL, the output signal noise floor may be positioned further below the hearing threshold, compared to the case of a moderate hearing loss. However, according to variations the noise floor of the output signal level may be positioned between 0 and 50 dB below the hearing threshold or between 5 and 15 dB below.

In another preferred embodiment, the selected position of the output signal noise floor level decreases when the hearing loss threshold increases.

It is also preferred that the noise floor level is determined as the lower part of the envelope of the considered signal. This represents one option to calculate the noise floor level.

Still other features of the present invention will become apparent to those skilled in the art from the following description wherein the invention will be explained in greater detail.

BRIEF DESCRIPTION OF THE DRAWINGS

By way of example, there is shown and described a preferred embodiment of this invention. As will be realized, the invention is capable of other embodiments, and its several details are capable of modification in various, obvious aspects, all without departing from the invention. Accordingly, the drawings and descriptions will be regarded as illustrative in nature and not as restrictive. In the drawings.

DETAILED DESCRIPTION

Figure 1:
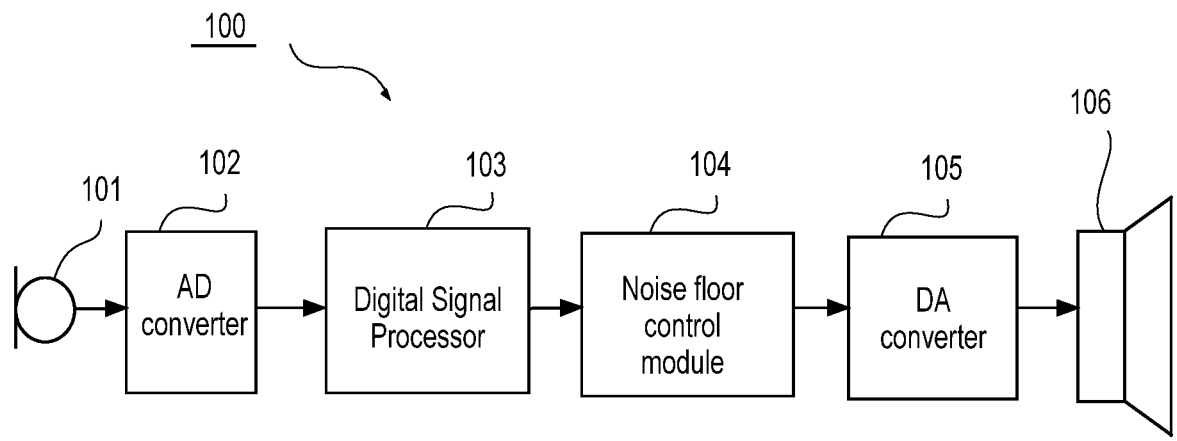
FIG. 1 illustrates highly schematically a hearing aid system according to an embodiment of the invention.

Reference is first made to FIG. 1 which schematically illustrates a hearing aid system 100 according to an embodiment of the invention. The hearing aid system 100 has one or two microphones 101, an analogue-to-digital (ND) converter 102, and a digital signal processor 103. The digital signal processor (DSP) 103 receives a digital signal from the A/D converter 102 and applies a first frequency-dependent gain adapted to compensate a hearing loss and suppressing noise and hereby providing a first processed input signal which is again frequency dependent, all of which may be carried out in plurality of ways that are well known for a person skilled in the art of hearing aid systems.

Subsequently, the first processed input signal is provided to a noise floor control module 104 which may be implemented as a separate module or as part of the DSP 103. While the previous processing steps provide compensation of hearing loss and noise suppression, the resulting output level of the first processed input signal may not be considered satisfactory by a user. This problem is addressed by the noise floor control module 104 by first determining a noise floor level of the first processed input signal and subsequently applying a second frequency dependent gain to the first processed input signal and hereby providing an output signal such that for at least one frequency range the noise floor level of the output signal is positioned at a selected position above or below a hearing threshold level (HTL) of the specific hearing aid system user. Finally, the output signal is provided to the digital-to-analogue (D/A) converter 105 and therefrom on to the loudspeaker 106 in order to provide the desired (which in the following may also be denoted optimum) sound.

Figure 2:
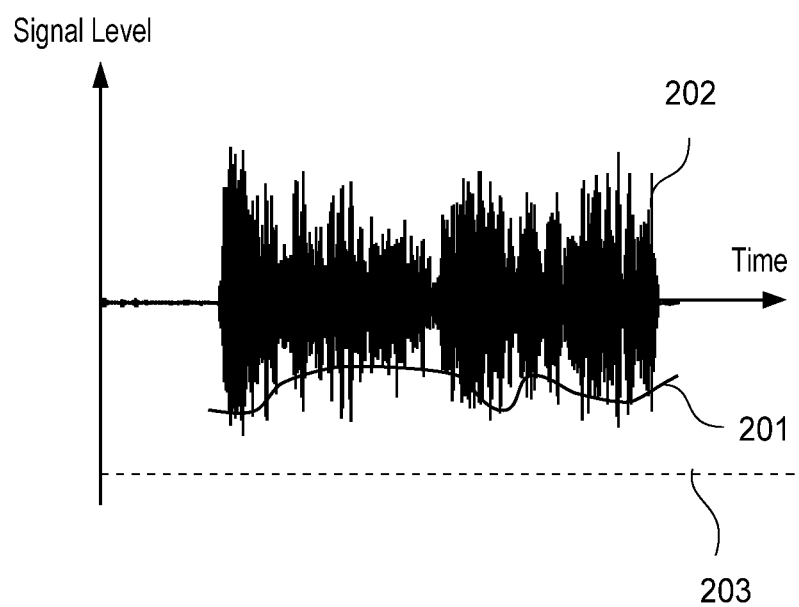
FIG. 2 illustrates a noise floor of a given signal and the position relative to a hearing threshold.

Reference is now made to FIG. 2 which illustrates a noise floor 201 of the first processed input signal 202, as determined by the noise floor control module 104, together with a hearing threshold level (HTL) 203 for the specific hearing aid system user. According to the present embodiment the noise floor level is determined as the lower envelope part of the first processed input signal. According to a variation the lower envelope part is determined as the $10^{th}$ percentile or a percentile in the range between say the 5th and 20th. According to another variation the noise floor level can be determined by determining, in at least parts of the considered frequency range, the minima of the first processed input signal and applying a low-pass filtering to the resulting sequence of points. According to yet another variation the noise floor level may be determined as the minima over an appropriate time window.

Thus the noise floor control module 104 determines the noise floor of the first processed input signal and based hereon and based on the hearing threshold level (HTL) of the specific hearing aid system user the noise floor control module 104 applies a second frequency dependent gain in order to position the noise floor of the output signal at a selected position relative to the HTL of the hearing aid system user. The inventors of the present application have found that the relative position of the output signal noise floor level and the hearing threshold level (both frequency dependent) is a key parameter to consider in order to achieve the optimum output level of the hearing aid.

By placing the output signal noise floor above the hearing threshold level, it can be ensured that the full dynamic range of the output signal is audible, as shown in FIG. 2. This may represent a preferred choice for a first group of users, as explained below. However, some users may prefer more comfort, and this can then be accomplished by placing the output signal noise floor below the hearing threshold level. Hereby the lower part of the dynamic range is inaudible to the user, whereby the provided sound may be perceived by some users as more comfortable because the lower part of the dynamic range at least in some situations may be perceived as being mainly noise.

Since the placement of the output signal noise floor level can be controlled individually in each frequency band, in some frequency bands, the user may have full audibility of the whole dynamic range of the signal, and in other bands the user may have audibility of only the louder parts of the signal.

Figure 3:
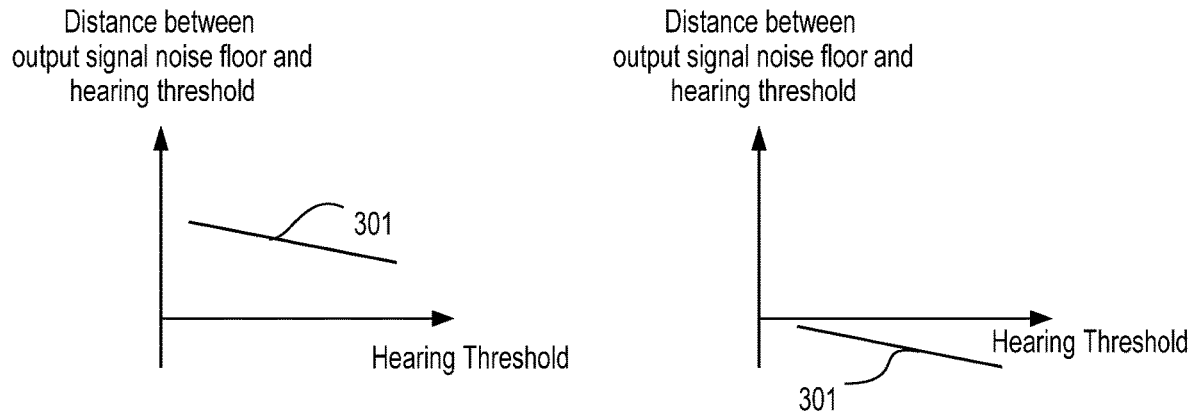
FIG. 3 illustrates options for selecting a relative position of the noise floor and the hearing threshold.

Reference is now made to FIG. 3, which highly schematically illustrates selected distances 301 between the output signal noise floor level and the hearing threshold level as a function of the hearing loss (i.e. the hearing threshold level) for respectively a "Richness Rationale" illustrated in the left part of FIG. 3 and a "Comfort Rationale" illustrated in the right part of FIG. 3.

The inventors have found that for mild hearing losses (HL), say below 40 dB HL, it will generally be preferred to place the output signal noise floor 301 above the hearing loss threshold, as illustrated in the left part of FIG. 3. One reason for this may be that the application of a relatively high (total) hearing aid gain generally will minimize the comb filter effect by avoiding that the applied total hearing aid gain and the gain of the directly transmitted sound are too close. Thus, if the total applied hearing aid gain is comparable to the gain (which is a negative gain, i.e. a damping) of the directly transmitted sound then the sound signals may interfere destructively and hereby provide the undesirable sound artefact known as the comb filter effect. Thus, according to variations, for mild hearing losses in the range between say 25 and 40 dB HL, the noise floor of the output signal level may be positioned between 10 and 50 dB above the hearing threshold or between 10 and 30 above.

On the other hand, hearing impaired with a severe hearing loss above say 55 dB HL may benefit from lowering the output signal noise floor to below the hearing threshold, while people with a moderate hearing loss in the range of say 40 dB HL to 55 dB HL are generally expected to prefer to have the output signal noise floor around the hearing threshold, as illustrated in the right part of FIG. 3.

Thus, according to variations, for moderate hearing losses in the range between 40 and 55 dB HL, the noise floor of the output signal level may be positioned between (+)10 dB above and (−)10 dB below the hearing threshold or between (+)5 and (−)5 dB above and below. and for severe hearing losses in the range above 55 dB HL, the noise floor of the output signal level may be positioned between 0 and 50 dB below the hearing threshold or between 5 and 15 below.

Generally, initial tests have indicated that some people with a moderate or severe hearing loss prefer sound where the output signal noise floor is placed below the hearing threshold, and that this does not have a detrimental effect on speech intelligibility, despite that this was to be expected based on e.g. the speech intelligibility index that forms the basis of some noise reduction algorithms.

In summary, noise floor control module 104 can be used to implement different hearing aid "rationales", as illustrated in FIG. 3.

According to the "Richness Rationale" illustrated in the left part of FIG. 3, the output signal noise floor level is placed above the hearing threshold level so that the user has full audibility of the whole dynamic range of the signal. As discussed in more detail above, this option is preferred by users with no hearing loss or a mild hearing loss in the range below 40 dB HL. According to this rationale it is preferred that the difference between the output signal noise floor level and the hearing loss threshold decreases when the hearing loss threshold increases, as can also be seen from FIG. 3.

According to a "Comfort Rationale" illustrated in the right part of FIG. 3, the output signal noise floor level is placed below the hearing threshold level because some users may prefer more comfort and this can then be accomplished by placing the noise floor below the hearing threshold level. Hereby the lower part of the dynamic range is inaudible to the user which generally will be perceived as noise suppression. As discussed in more detail above, this option is generally (but not necessarily) preferred by users with a moderate or severe hearing loss (i.e. in the range above say 40 dB HL). According to this rationale, it is furthermore preferred that the distance between the output signal noise floor level and the hearing loss threshold increases when the hearing loss threshold increases, as can also be seen from FIG. 3. More specifically, users with a moderate hearing loss in the range of approximately 40 dB HL to 55 dB HL prefer an output signal noise floor slightly below the hearing threshold level, and users with a severe hearing loss in the range of approximately 40 dB HL to 55 dB HL prefer an output signal noise floor further below the level of users with a moderate hearing loss.

According to a variation the noise floor control module 104 may be noise level dependent, whereby the second frequency dependent gain may be faded out outside a first particular noise level range and faded in inside a second particular noise level range.

In another variation the noise floor control module 104 is only active in louder sound environments that may be identified using a variety of well known sound environment classification techniques. More specifically this may be achieved by determining a measure representing the noise level of the ambient sound environment and fading out the application of the second frequency dependent gain if said measure falls below a given threshold. Thus according to a specific variation the noise floor control module 104 is deactivated for sound environments having a Sound Pressure Level (SPL) below say between say 62-65 dB SPL (which corresponds to normal speech in quiet surroundings) and then gradually fade in the noise floor control module 104 with increasing SPL.

According to yet another variation the placement of the output signal noise floor is made adaptive based on a measure representing the magnitude of the dynamic range of the input signal—or alternatively of the first processed input signal—by positioning the output signal noise floor for input signals with a large dynamic range lower than for input signals with a smaller dynamic range. Generally, it will be advantageous to position the output signal noise floor level relatively low when the dynamic range is relatively large in order to avoid sound artefacts due to e.g. signal clipping and also in order to improve comfort. On the other hand, it will generally be advantageous to position the output signal noise floor level relatively high when the dynamic range is relatively small in order to avoid that information is lost.

Thus according to a specific variation the output signal noise floor may be positioned close to the hearing threshold for a magnitude of the dynamic range of the input signal around 5 dB and positioned in the range of 5-10 dB below the hearing threshold when the magnitude of the dynamic range of the input signal around is larger than 15 dB and then adaptively positioned between these positions in dependence on the determined magnitude of the dynamic range of the input signal.

More specifically the magnitude of the dynamic range may be determined as the difference between say the $10^{th}$ and the $90^{th}$ percentile or as the difference between a lower percentile from the range between the $5^{th}$ and the $20^{th}$ and an upper percentile in the range between the $80^{th}$ and the $99^{th}$ percentile.

According to a specific variation of the FIG. 1 embodiment the hearing aid system 100 is replaced by an ear level audio system without hearing loss compensation but still including noise suppression. Users of such systems will generally have normal hearing, which in the context of hearing aid systems correspond to a very mild hearing loss and as such will prefer to have the noise floor level of the first processed input signal above their hearing threshold and typically higher above their hearing threshold than people with a hearing loss. However, also for persons with normal hearing it may be advantageous to select a specific position of the output signal noise floor level relative to their hearing threshold, because this position may vary due to the noise suppression provided by the ear level audio system.

According to an even more specific variation of the present invention the selected position of the noise floor level of the output signal relative to the hearing threshold is individualized by allowing the user to find the preferred selected position by choosing between different positions of the noise floor level in various sound environments.

However, according to a still more specific variation of the present invention the different positions offered for the specific user to choose between are based on the specific user's hearing threshold.

According to an even more specific variation this process of finding the individually preferred selected position may be carried out using the methods disclosed in WO-A1-2016004983 by the same applicant which is hereby incorporated by reference. More specifically reference may be given to the method steps of claim 1 as given in page 22, line 1-page 23, line 4 of the referenced document.

Figure 4:
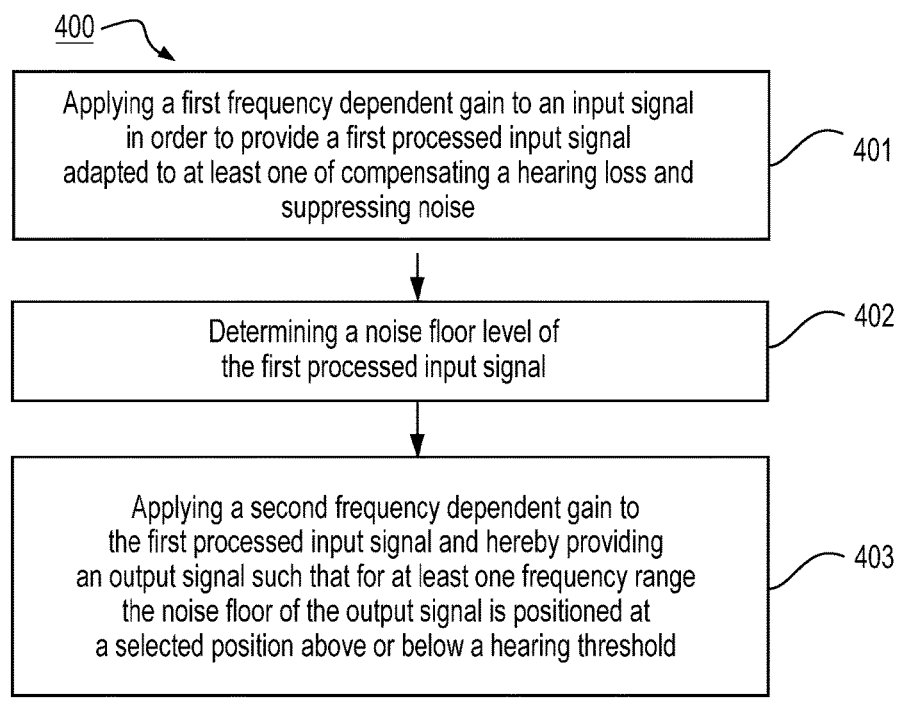
FIG. 4 illustrates a method of operating an ear level audio system according to an embodiment of the invention.

Reference is now made to FIG. 4 which illustrates a method 400 of operating an ear level audio system according to an embodiment of the invention.

In a first step (401) a first frequency dependent gain is applied to an input signal in order to provide a first processed input signal adapted to at least one of compensating a hearing loss and suppressing noise.

In a second step (402) a noise floor of the first processed input signal is determined.

In a third step (403) a second frequency dependent gain is applied to the first processed input signal whereby an output signal is provided such that for at least one frequency range the noise floor level of the output signal is positioned at a selected position above or below a hearing threshold.

It is generally noted that even though many features of the present invention are disclosed in embodiments comprising other features then this does not imply that these features by necessity need to be combined.

As one example the concept of making the placement of the output signal noise floor adaptive based on a measure representing the magnitude of the dynamic range of the input signal—or alternatively of the first processed input signal—is generally independent of the specific intervals selected for mild, moderate and severe hearing losses and likewise independent on whether the feature of fading out the application of the second frequency dependent gain in response to the noise level of the ambient sound environment is implemented.

As another example the feature of allowing the user to find the preferred selected position of the output signal noise floor level by choosing between different positions of the noise floor level in various sound environments may likewise be combined with the other disclosed embodiments and their variations.

Other modifications and variations of the structures and procedures will be evident to those skilled in the art.

The invention claimed is:

1. A method of operating an ear level audio system, comprising the steps of:
    applying a first frequency dependent gain to an input signal in order to provide a first processed input signal adapted to at least one of compensating a hearing loss and suppressing noise;
    determining a noise floor level of the first processed input signal;
    applying a second frequency dependent gain to the first processed input signal based on a relative position of the noise floor level of the processed input signal and a hearing threshold to provide an output signal that for at least one frequency range the noise floor level of the output signal is positioned at a selected position above or below the hearing threshold, wherein, in a case of a mild hearing loss in the range of 25 dB hearing loss to 40 dB hearing loss, the selected position of the noise floor level of the output signal is between 10 and 50 dB above the hearing threshold; or wherein, in a case of a moderate hearing loss in the range of 40 dB hearing loss to 55 dB hearing loss, the selected position of the noise floor level of the output signal is positioned between 10 dB above and 10 dB below the haring threshold; or wherein, in a case of a severe hearing loss in the range above 55 dB hearing loss, the selected position of the noise floor level of the output signal is positioned between 0 and 50 dB below the hearing threshold.

2. The method of claim 1, wherein the step of applying the second frequency dependent gain comprises the further steps of:

determining a measure representing the noise level of the ambient sound environment; and fading out the application of the second frequency dependent gain if said measure falls below a given threshold.

3. The method of claim 1, wherein the step of applying the second frequency dependent gain comprises the further steps of:

determining a measure representing the magnitude of the dynamic range of at least one of the input signal and the first processed input signal;

selecting adaptively a higher output signal noise floor level for small dynamic range measures compared to large dynamic range measures.

4. The method according to claim 1, wherein the selected position of the noise floor level of the output signal decreases when the hearing loss threshold increases.

5. The method according to claim 1, wherein the step of determining the noise floor level of the first processed input signal is carried out by determining the level of the lower envelope part.

6. An ear level audio system comprising an acoustical-electrical input transducer, a digital signal processor, a noise floor control module and an electrical-acoustical output transducer, wherein the digital signal processor is adapted to perform the method of claim 1.

7. The ear level audio system according to claim 6, wherein the ear level audio system is a hearing aid system.

8. A computer program product with instructions which, when executed on a computer, perform the method of claim 1.

* * * * *